(12) United States Patent
Peng et al.

(10) Patent No.: US 11,663,389 B2
(45) Date of Patent: May 30, 2023

(54) CIRCUIT LAYOUT

(71) Applicant: Taiwan Semiconductor Manufacturing Company, Ltd., Hsinchu (TW)

(72) Inventors: Shih-Wei Peng, Hsinchu (TW); Kam-Tou Sio, Zhubei (TW); Jiann-Tyng Tzeng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/232,571

(22) Filed: Apr. 16, 2021

(65) Prior Publication Data

US 2022/0335193 A1  Oct. 20, 2022

(51) Int. Cl.
*G06F 30/392* (2020.01)
*G06F 30/394* (2020.01)
*G06F 30/396* (2020.01)

(52) U.S. Cl.
CPC .......... *G06F 30/392* (2020.01); *G06F 30/394* (2020.01); *G06F 30/396* (2020.01)

(58) Field of Classification Search
USPC ........................................................ 716/119
See application file for complete search history.

(56) References Cited

U.S. PATENT DOCUMENTS

| | | | |
|---|---|---|---|
| 11,322,171 B1* | 5/2022 | Wu | G10L 25/21 |
| 2014/0007035 A1* | 1/2014 | Turner, Jr. | G06F 30/392 |
| | | | 716/134 |
| 2015/0149969 A1* | 5/2015 | Wang | G06F 30/398 |
| | | | 716/52 |
| 2017/0137803 A1* | 5/2017 | Wang | C12N 7/00 |
| 2018/0032658 A1* | 2/2018 | Ha | G06F 30/392 |
| 2018/0144082 A1* | 5/2018 | Hanchinal | G06F 30/398 |
| 2018/0196917 A1* | 7/2018 | Van Rooyen | H01L 27/0207 |
| 2020/0105671 A1* | 4/2020 | Lai | G06F 30/39 |
| 2020/0184278 A1* | 6/2020 | Zadeh | G06K 9/6264 |

* cited by examiner

*Primary Examiner* — Mohammed Alam
(74) *Attorney, Agent, or Firm* — Merchant & Gould P.C.

(57) ABSTRACT

Generating a circuit layout is provided. A circuit layout associated with a circuit is received. A parallel pattern recognition is performed on the circuit layout. Performing the parallel pattern recognition includes determining that there is a parallel pattern in the circuit layout. In response to determining that there is a parallel pattern in the circuit layout, a cell swap for a first cell associated with the parallel pattern with a second cell is performed. After the cell swap for the first cell, engineering change order routing is performed to connect the second cell in the circuit layout. An updated circuit layout having the second cell is provided.

20 Claims, 11 Drawing Sheets

CIRCUIT LAYOUT

BACKGROUND

An Integrated Circuit (IC) includes one or more semiconductor devices. One way in which to represent a semiconductor device is with a plan view diagram referred to as a circuit layout. A circuit layout includes one or more standard cells which correspond to active devices having a specific functionality. Cells for active devices which are routinely repeated are often included in a cell library. These cells are called standard cells in some instances. Cells include pins, which are used to convey signals into and out of the cells. At least one pin of a cell is connected to a pin of at least one other cell in order to transfer signals between the various cells. Routing lines are provided to interconnect the pins of various cells to facilitate signal transfer between different cells to provide a desired functionality of the circuit layout.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides processes to improve a circuit by reducing a capacitance of one or more cells of the circuit. Processes disclosed herein reduce the capacitance by reducing a parallel overlap between input/output pins, also referred to as routing pins, of the cells. More specifically, the processes disclosed herein define a blockage location, an area where formation of the routing pins or routing metals connecting to the routing pins being forbidden, to reduce a parallel overlap between the routing pins of cells. In addition, the processes disclosed herein create a series of electrically equivalent cell layouts with the blockage location to reduce the parallel overlap between the routing pins. Moreover, the processes disclosed herein provide cell swap and engineering change order routing to further reduce the overlap between the routing pins of cells.

Figure 1:
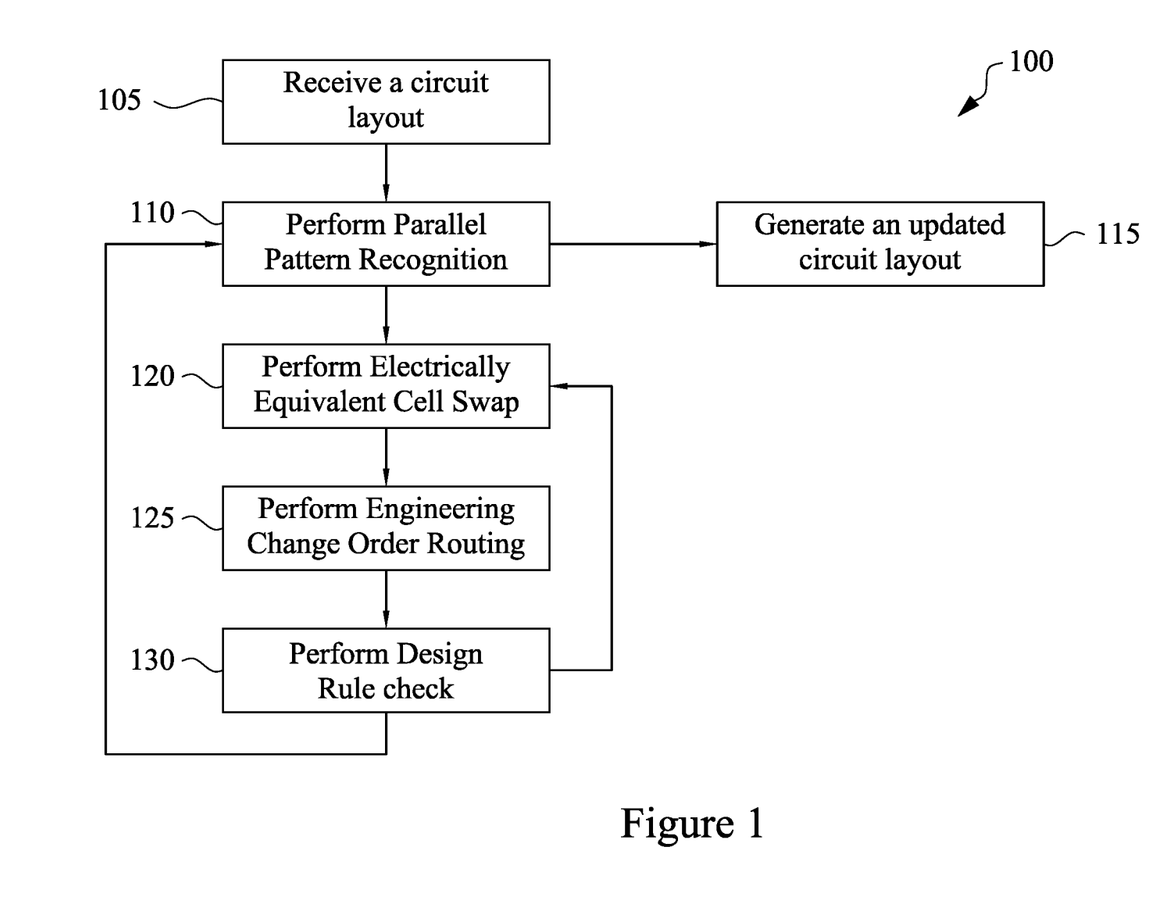
FIG. 1 is a flow diagram illustrating a method of generating a circuit layout, in accordance with some embodiments.

FIG. 1 is an example flow diagram illustrating stages of a method 100 for generating a circuit layout in accordance with some example embodiments. In accordance with example embodiments, the circuit layout generated using method 100 has a lesser capacitance than conventional methods. In examples, method 100 may be implemented using EDA environment 700 as described in more detail above with respect to FIG. 7 or a semiconductor device manufacturing system 800 described with respect to FIG. 8. Ways to implement the stages of method 100 will be described in greater detail below.

At stage 105 of method 100, a circuit layout is received. The circuit layout may correspond to a circuit or a chip. The circuit layout is a representation of a circuit in terms of planar geometric shapes which correspond to patterns of metal, oxide, or semiconductor layers that make up the components of the circuit. In examples, a circuit layout includes cells that perform analog or logic functions or operations of a circuit design. The cells are chosen from a cell library. Cells for active devices which are routinely repeated are often included in the cell library. These cells are called standard cells in some instances. Cells are also referred to as a modules, blocks, macros, etc. The circuit layout further includes a physical dimensions and placements of the cells and their interconnections. In example embodiments, the circuit layout is also referred to as a chip layout, a device layout, or a die layout. After receiving the circuit layout at stage 105, method 100 proceeds to stage 110.

At stage 110 of method 100, parallel pattern recognition is performed on the circuit layout. In example embodiments, performing the parallel pattern recognition includes determining whether routing pins and routing metals of any cell of the circuit layout overlap when projected on one another. For example, performing the parallel pattern recognition includes determining whether a projection of one routing pin on the other routing pin of a cell results in an overlap. If there is an overlap in the routing pins of the cell, then the cell is categorized as or marked as containing a parallel pattern. If no cell of the circuit layout is categorized as containing a parallel pattern, then an updated circuit layout for the circuit is generated at stage 115 marking completion of method 100. However, if a cell in the circuit layout is categorized as containing a parallel pattern, then method 100 proceeds to stage 120.

At stage 120 of method 100, an Electrically Equivalent (EEQ) cell swap is performed. For example, in response to determining that a cell of the received circuit layout is categorized as or marked as containing a parallel pattern, then an EEQ cell (also referred to as a second cell) for the marked cell is determined. In examples, the EEQ cell is determined from the cell library. The EEQ cell may have same functionality as that of the cell being swapped but a different routing pin style. For example, the routing pin style of the EEQ cell may be such that a projection of one routing pin on the other routing pin does not result in an overlap. The cell in the circuit layout with a parallel pattern is replaced with the EEQ cell. After performing the EEQ cell swap at block 120, method 100 proceeds to stage 125.

At stage 125 of method 100, an Engineering Change Order (ECO) routing is performed. In examples, the ECO specifies proposed changes to the existing circuit based on pins and dimensions of the EEQ cell. The ECO routing is used to summarize the modifications, finalize the details of the modifications, and obtain necessary approvals. For example, the ECO routing includes connections to the input pin and the output pin of the EEQ cell with other cells of the circuit in the circuit layout. After performing the ECO routing at stage 125, method 100 proceeds to stage 130.

At stage 130 of method 100, Design Rule Check (DRC) is performed. In examples, DRC is a physical design process to determine if the circuit layout satisfies a number of rules as defined for the circuit or the chip and report any violations. The rules may include one or more of a minimum width and spacing for metal, a minimum width and spacing for via, an end of line spacing, a fat wire via keep out enclosure, a minimum area, wide metal jog, misaligned via wire, special notch spacing, etc. After the completion of the DRC at stage 130, method 100 loops back to stage 110.

At stage 110 of method 100, the parallel pattern recognition is performed on the circuit layout. If there is another cell in the circuit layout with a parallel pattern, then that cell is categorized as or marked as containing a parallel pattern and method 100 continues to stage 120. However, if no cell of the circuit layout is categorized as containing a parallel pattern, then an updated circuit layout for the circuit is generated at stage 115 marking the completion of method 100.

Figure 2:
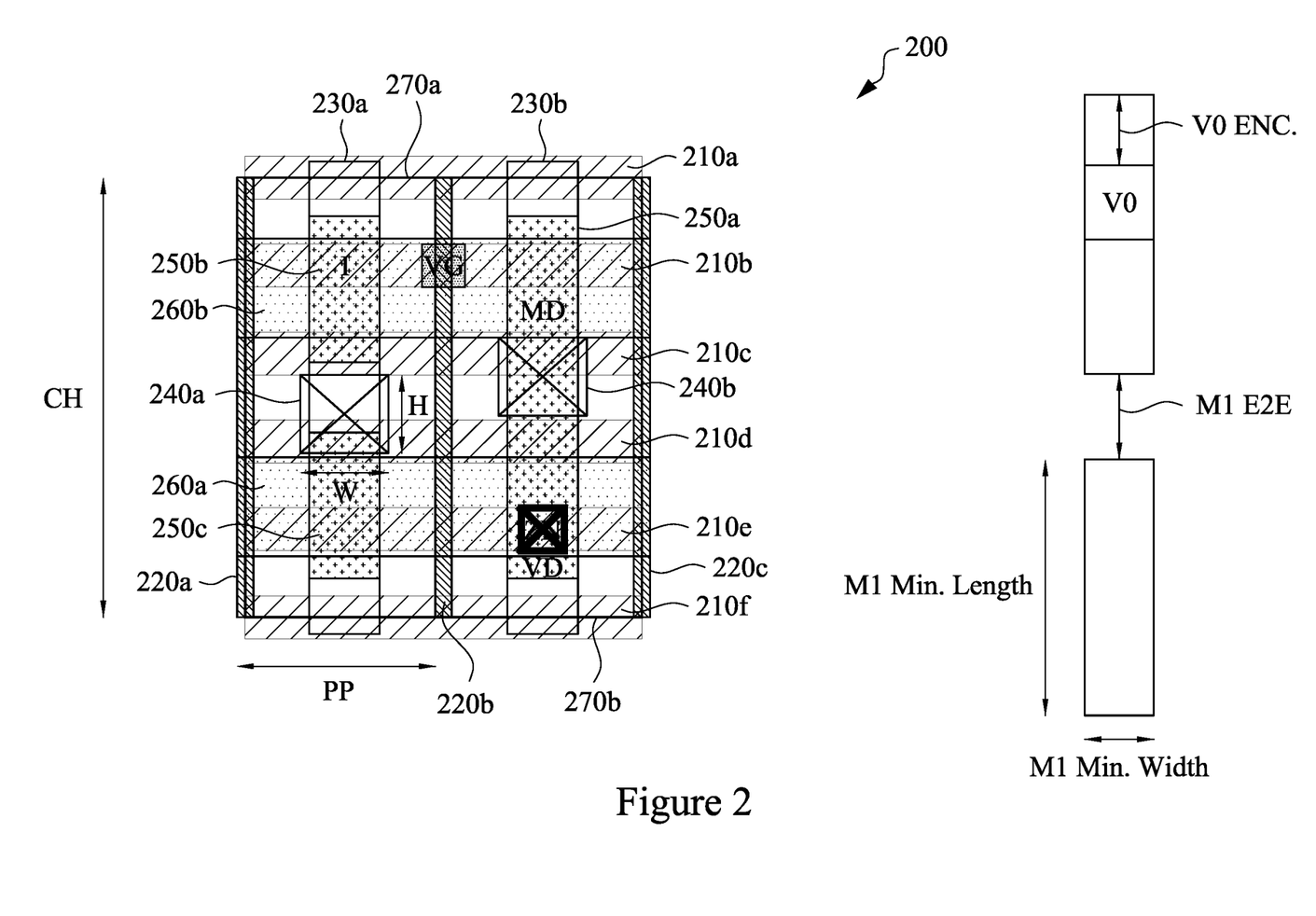
FIG. 2 is diagram illustrating a cell layout, in accordance with some embodiments.

FIG. 2 is a diagram illustrating a cell layout 200 in accordance with some embodiments. As shown in FIG. 2, cell layout 200 includes a plurality of first metal tracks (that is, first first metal track 210a, second first metal track 210b, third first metal track 210c, fourth first metal track 210d, fifth first metal track 210e, and sixth first metal track 210f). Each of the plurality of first metal track are also referred to as $0^{th}$ metal layer track (that is, M0 track). Each of the plurality of first metal track are arranged parallel to each other at a predetermined distance from each other. In example embodiments, the first metal tracks are formed in a first metal layer which is the closest metal layer to a substrate layer. Only six first metal tracks are illustrated in FIG. 2, but the disclosure is not limited thereto.

As shown in cell layout 200, the plurality of first metal tracks extend in a first direction. In some examples, first first metal track 210a and sixth first metal track 210f are shared by neighboring cells. In addition, second first metal track 210b may connect to an input pin at an input pin access point (labeled as "I") and fifth first metal track 210e may connect to an output pin at an output pin access point (labeled as "ZN"). A distance between the center of two adjacent first metal tracks (for example, between second first metal track 210b and third first metal track 210c) is also referred to as a first metal pitch (also referred to as "M0 Pitch).

Continuing with FIG. 2, cell layout 200 further includes a plurality of poly tracks (that is, a first poly track 220a, a second poly track 220b, and a third poly track 220c). As shown in cell layout 200, the plurality of second metal poly tracks extend in a second direction. The second direction is orthogonal to the first direction. A distance between the center of two adjacent poly tracks (for example, between first poly track 220a and second poly track 220b) is also referred to as a poly pitch (represented as "PP"). An area or space between each two adjacent poly tracks is also referred to as a column. Second poly track 220b of FIG. 2 is shown to be associated with a via on a gate (represented as "VG"). Only three poly tracks are illustrated in FIG. 2, but the disclosure is not limited thereto.

As shown in FIG. 2, cell layout 200 further includes a plurality of second metal tracks (that is, first second metal track 230a and a second second metal track 230b). Each of the plurality of second metal tracks are located between a column. For example, first second metal track 230a is located in a first column and second second metal track 230b is located in a second column. As shown in cell layout 200, the plurality of second metal tracks extend in a second direction. The second direction is orthogonal to the first direction. A distance between the center of two adjacent first metal tracks (for example, between first second metal track 230a and second second metal track 230b) is also referred to as a second metal pitch (also referred to as "M1 Pitch). In example embodiments, the second metal tracks are formed in a second metal layer which is the closest metal layer to the first metal layer. Only two second metal tracks are illustrated in FIG. 2, but the disclosure is not limited thereto.

Continuing with FIG. 2, cell layout 200 further includes a plurality of blockage locations (for example, a first blockage location 240a and a second blockage location 240b). First blockage location 240a is associated with first column and second blockage location 240b is associated with second column. The plurality of blockage locations define an area or a location where a second metal plate may not be formed. The blockage location is defined with a blockage height H and a blockage width W. Only two blockage locations are illustrated in FIG. 2, but the disclosure is not limited thereto. Processes for defining a blockage location for a cell are discussed in a detail with reference to FIGS. 4-6 of the disclosure.

Cell layout 200 further includes a plurality of Metal Dielectric (MD) tracks (for example, first MD track 250a, a second MD track 250b, and a third MD track 250c). VD represents a via on MD track, for example, first MD track 250a. The plurality of MD tracks also extend in a second direction. Although, only two MD tracks are illustrated in FIG. 2, but the disclosure is not limited thereto.

Cell layout 200 further includes a plurality of substrate tracks (that is, first substrate track 260a and a second substrate track 260b). The plurality substrate tracks also extend in the first direction. The first metal tracks (that is, M0 tracks) are formed on one or more of the plurality of substrate track. Only two substrate tracks are illustrated in FIG. 2, but the disclosure is not limited thereto.

Cell layout 200 further includes a first cell boundary 270a and a second cell boundary 270b. First cell boundary 270a is opposite and parallel to second cell boundary 270b. A distance between first cell boundary 270a and second cell boundary 270b is also referred to as a cell height (represented as "CH"). Moreover, a minimum width of a second metal plate is represented as a M1 Min. Width and a minimum length of a second metal plate is represented as a M1 Min. length. In addition, a space between two second metal plates is represented as M1 E2E and a distance between a via V0 and an end of a second metal plate is referred to as a V0 Enc. In example embodiments, the M1 Min. Width is approximately equal to the width of the blockage location. In addition, the height of the blockage location is approximately equal to the M1 E2E (that is, the space between two second metal plates).

Figure 3:
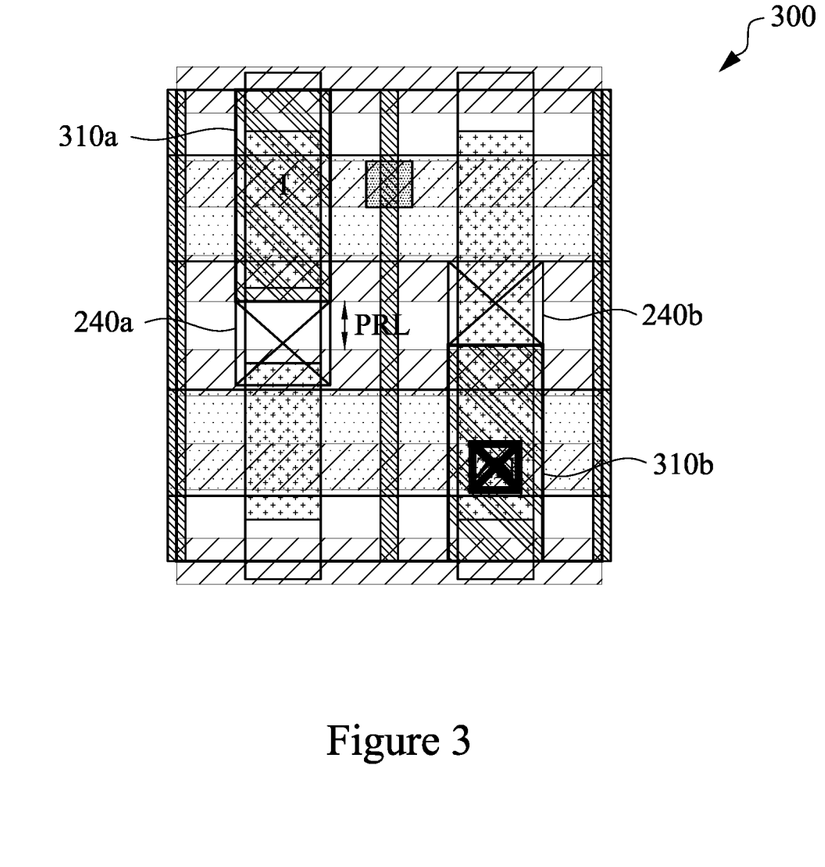
FIG. 3 is diagram illustrating another cell layout, in accordance with some embodiments.

FIG. 3 illustrates another cell layout 300 in accordance with some embodiments. As shown in FIG. 3, cell layout 300 includes a first second metal plate 310a and a second second metal plate 310b. First second metal plate 310a is placed such that it does not overlap with first blockage location 240a. First second metal plate 310a can be connected to the M0 track with the "I" pin. In addition, second second metal plate 310b is placed such that it does not overlap with second blockage location 240b. Second second metal plate 310b is connected to the M0 track with the "ZN" pin. In such configuration, first second metal plate 310a and second second metal plate 310b do not overlap, and hence do not create a parallel pattern, as the closest ends of first second metal plate 310a and second second metal plate 310b are at least PRL distance apart.

Figure 4:
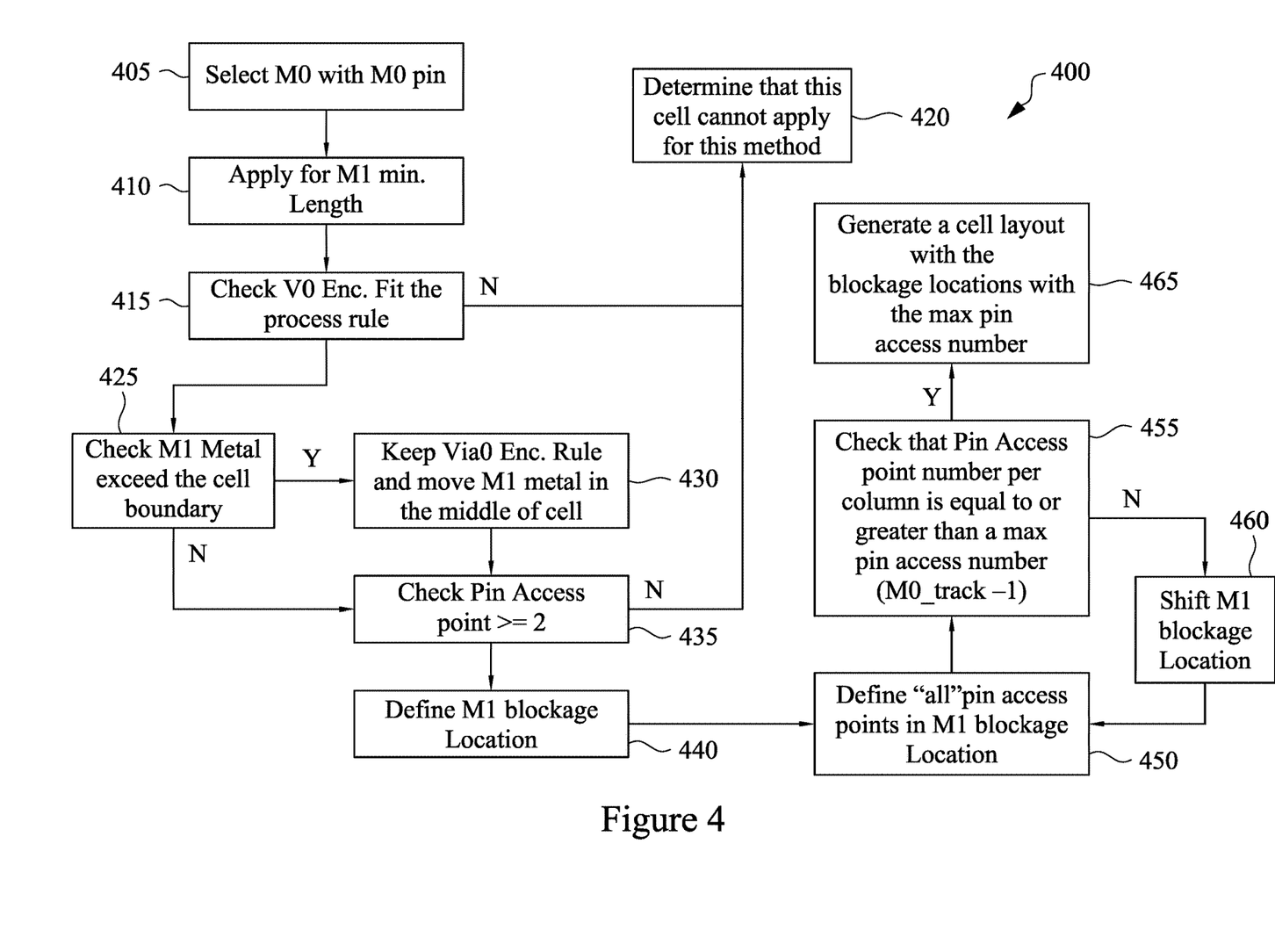
FIG. 4 is a flow diagram illustrating a method for generating a cell layout, in accordance with some embodiments.

FIG. 4 is a flow diagram illustrating stages of a method 400 for creating a cell layout with a blockage location in accordance with some embodiments. Method 400 may be implemented using EDA environment 700 as described in more detail above with respect to FIG. 7 or semiconductor device manufacturing system 800 described with respect to FIG. 8. Ways to implement the stages of method 400 will be described in greater detail below along with FIGS. 5A-5D and FIGS. 6A-6C.

Figure 5A:
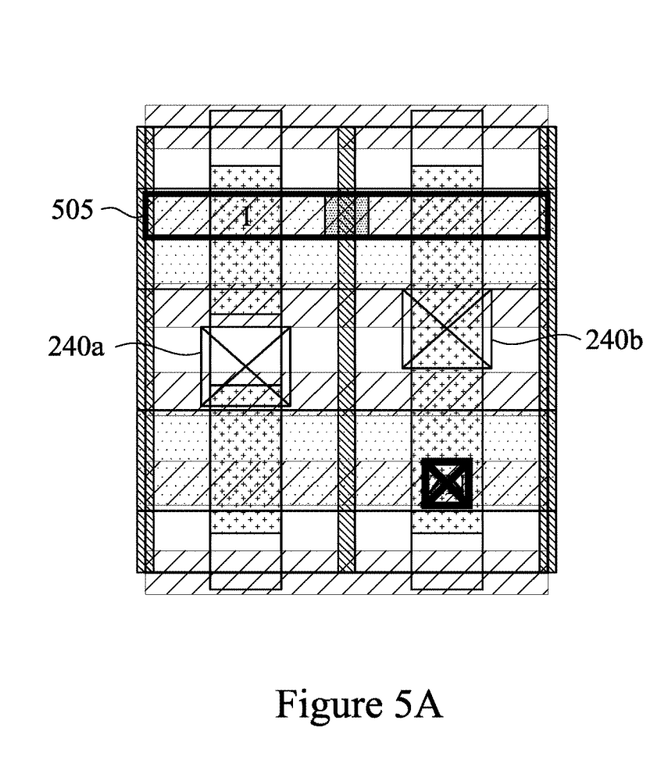
FIGS. 5A-5D are diagrams illustrating stages of the method for generating the cell layout, in accordance with some embodiments.

At stage 405 of method 400, a first metal track is selected. In examples, a first metal track with an input pin or an output pin is selected. For example, and as shown in FIG. 5A, M0 track with the input pin "I" is selected (indicated by arrow 505). After selecting the first metal track at stage 405, method 400 proceeds to stage 410.

Figure 5B:
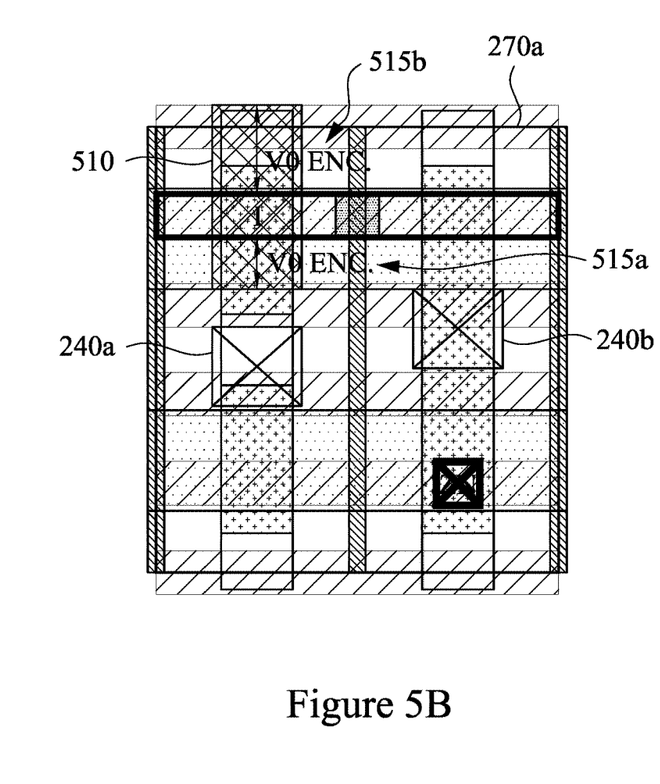

At stage 410 of method 400, a minimum length for a second metal plate is applied for at a first position. In examples, the minimum length for the second metal plate is applied for in the first position such that the minimum length overlaps with the selected first metal track with the input pin "I". For example, and as shown in FIG. 5B, M1 plate is applied such that the M1 plate overlaps with the selected M0 track with the input "I" (indicated by arrow 510). In examples, the M1 plate is applied or positioned such that it no portion of the M1 plate overlaps a blockage location, for example, first blockage location 240a. After applying for the minimum length for the second metal plate at the first position at stage 410, method 400 proceeds to stage 415.

At stage 415 of method 400, a check is performed to determine if the V0 enclosure at the first position for the second metal plate fits a process rule. In examples, the V0 enclosure is a minimum distance between an end of the second metal plate and the nearest edge of the first metal track (indicated by arrows 515a and 515b). The minimum distance is predefined for the cell layout. In response to determining that the V0 enclosure at the first position for the second metal plate does not fit the process rule, then method 400 proceeds to stage 420 where it is determined that the current cell cannot apply method 400. However, in response to determining that the V0 enclosure at the first position for the second metal plate fits the process rule, then method 400 proceeds to stage 425 where it is determined that method 400 cannot be applied on the current cell.

At stage 425 of method 400 a check is performed to determine if the minimum length for the second metal plate at the first position exceeds a cell boundary. For example, and as shown in FIG. 5B, the minimum length for the second metal plate at the first position exceeds a cell boundary, for example, first cell boundary 270a. In response to determining that the minimum length for the second metal plate at the first location does not exceed first cell boundary 270a, method 400 proceeds to stage 435. However, in response to determining that the minimum length for the second metal plate at the first location exceeds first cell boundary 270a, method 400 proceeds to stage 430.

Figure 5C:
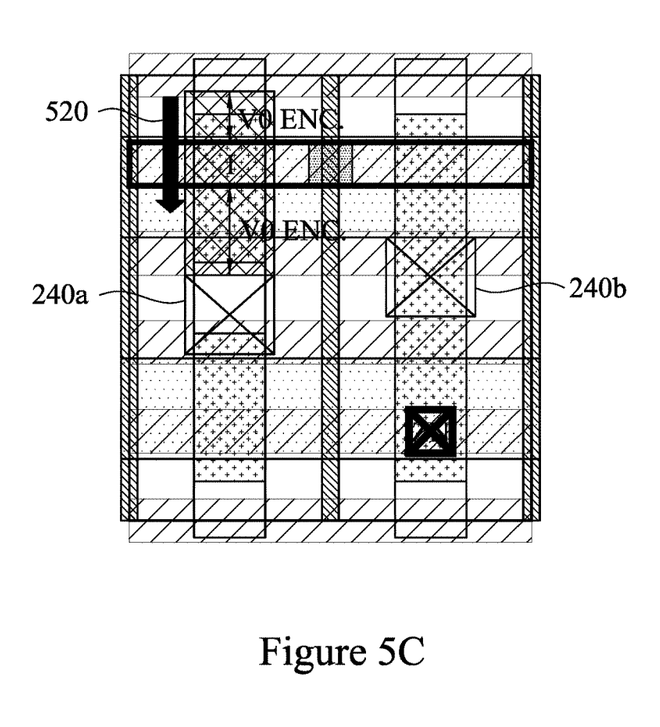
Figure 5D:
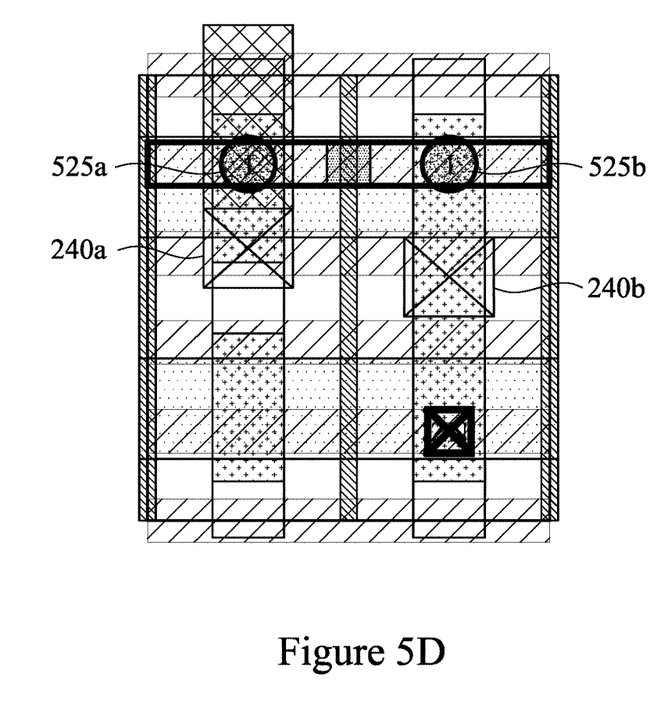

At stage 430 of method 400, the minimum length for the second metal plate is moved towards the middle of the cell keeping the V0 enclosure rule towards a second location. For example, and as represented by arrow 520 in FIG. 5C, the second metal plate is moved from its current location (that is, the first location) towards the middle of the cell to a second location. However, and as shown in FIG. 5C, the minimum length for the second metal plate is moved to the second location such that even at the second location it does not impose over first blockage location 240a. After moving the minimum length of the second metal plate at the second location, method 400 proceeds to stage 435.

At stage 435 of method 400, pin access points are checked. The pin access points are checked at the second location of the minimum length for the second metal plate. For example, the pin access points (that is first pin access point 525a and second pin access pin 525b) are counted and it is determined that a number of the pin access points is equal to greater than two. In response to determining that the number of the pin access points is not equal to or greater than two, method 400 proceeds to stage 420 where it is determined that the current cell cannot apply method 400. However, in response to determining that the number of the pin access points is equal to or greater than two, method 400 proceeds to stage 440 where the blockage location for the M1 plate is defined at the second location. The blockage location is defined towards the center of the cell on the second metal track. After defining the blockage location for the M1 plate, method 400 proceeds to stage 445.

Figure 6A:
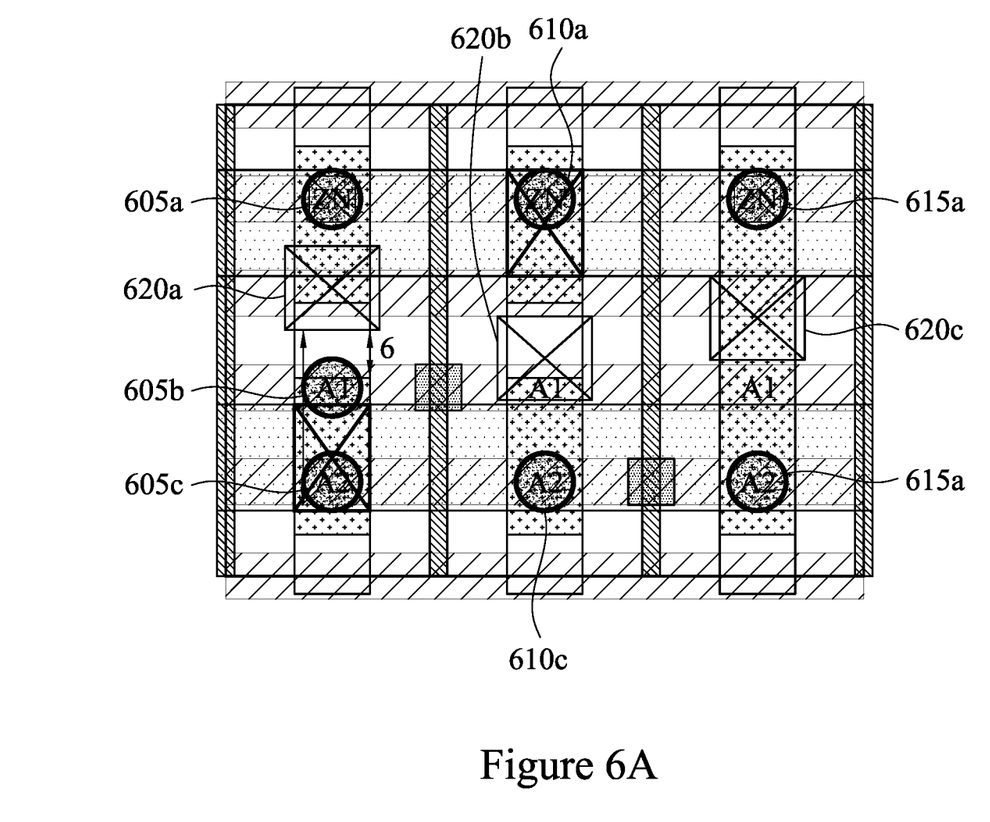
FIGS. 6A-6C are diagrams further illustrating stages of the method for generating the cell layout, in accordance with some embodiments.

At stage 450 of method 400, all pin access points for the M1 plate in the blockage location are defined. For example, and as shown in FIG. 6A, first column first pin access point 605a, first column second pin access point 605b, first column third pin access point 605c, second column first pin access point 610a, second column third pin access point 610c, third column first pin access point 615a, and third column third pin access point 615c are defined. After defining all pin access points for the M1 plate, method 400 proceeds to stage 455.

At stage 455 of method 400, a check is performed to determine that a number of the pin access points for each column is equal to or greater than a maximum pin access point number. In examples, the maximum pin access point number is determined as a number of M0 tracks in the cell minus one. If the number of the pin access points for each column is equal to or greater than the maximum pin access point number, then method 400 proceeds to stage 465. However, if the number of the pin access points for each column is not equal to or greater than the maximum pin access point number, then method 400 proceeds to stage 460.

As shown in FIG. 6A, the number of the pin access point for a first column is three, for a second column is two, and for a third column is two. In addition, the maximum pin access point number for each of the first column, the second column, and the third column is three. Hence, the number of the pin access points for the first column is equal to the maximum pin access point number. However, the number of the pin access points for both the second column and the third column is less than the maximum pin access point number.

Figure 6B:
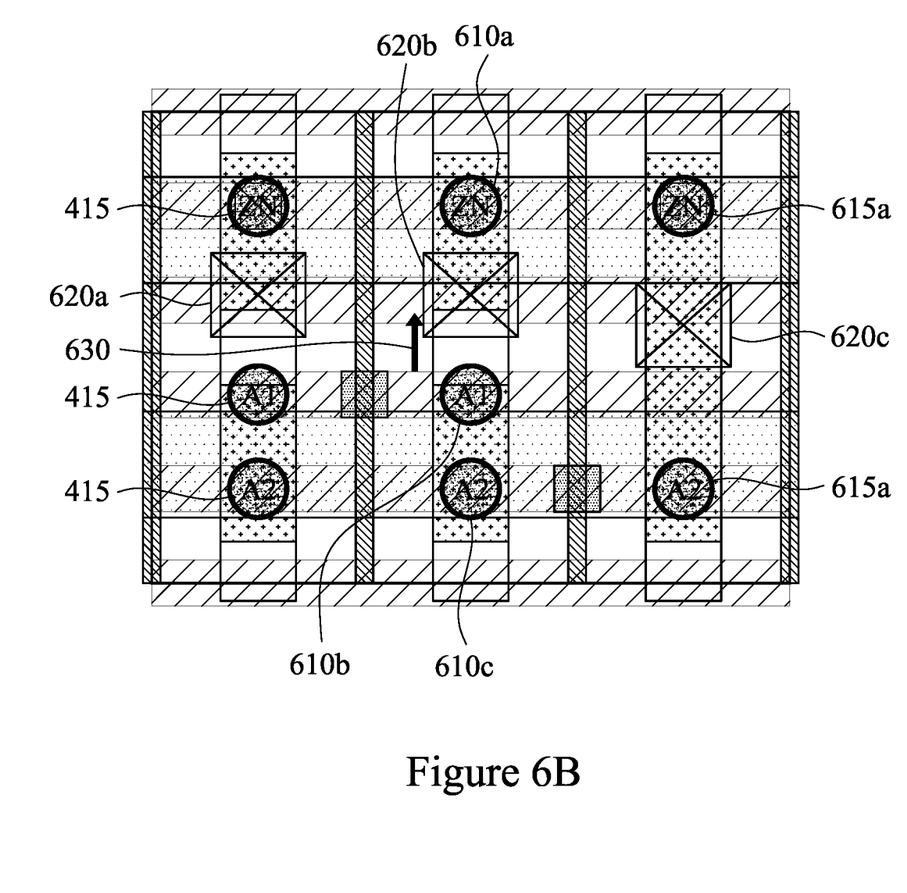
Figure 6C:
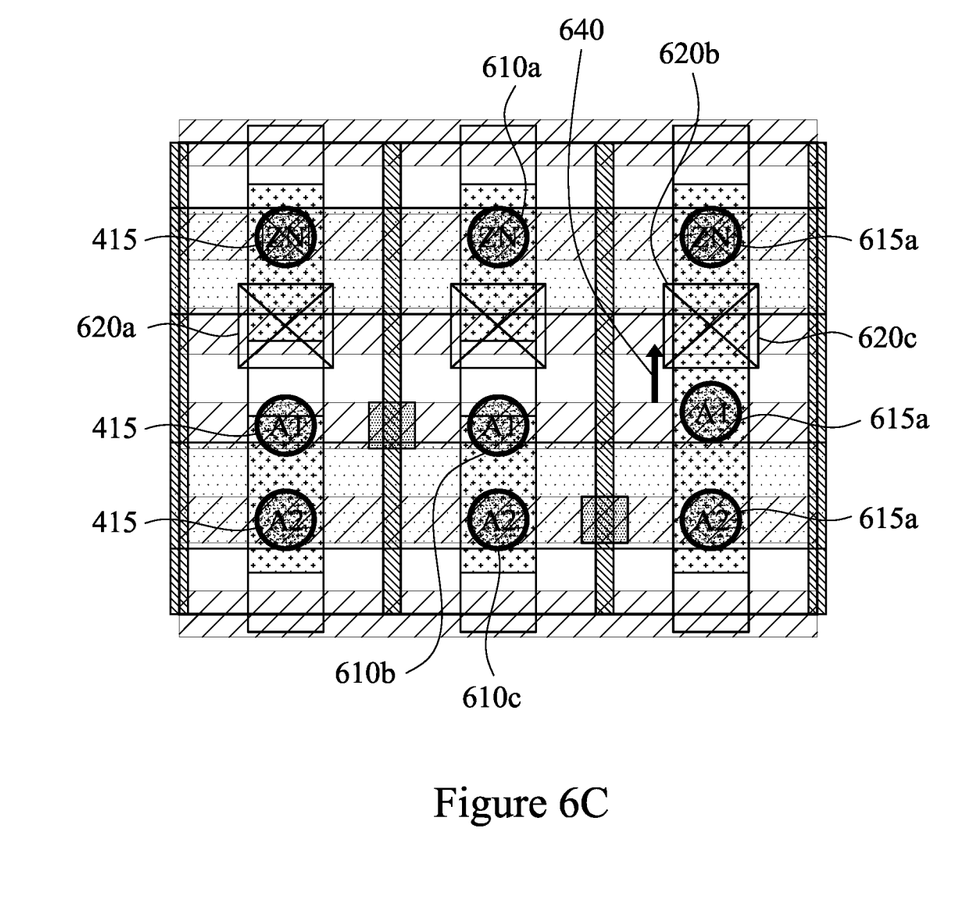

At stage 460 of method 400, for each column with the number of the pin access less than the maximum pin access point number, the blockage location is shifted. For example, and as shown in FIG. 6B, the location for second blockage location 620b is shifted (arrow 630). In example embodiments, the location for second blockage location 620b is shifted such that another pin access points becomes available. Similarly, and as shown in FIG. 6C, the location for third blockage location 620c is shifted (arrow 640). In example embodiments, the location for third blockage location 620c is shifted such that another pin access points becomes available.

After shifting the blockage location at stage 460, method 400 loops back to stage 450, wherein all pin access points for the M1 plate in the blockage location are defined. As shown in FIG. 6B, after shifting of second blockage location 620b, the number of the pin access points for the second column increases to three. As shown in FIG. 6C, after shifting of third blockage location 620c, the number of the pin access points for the third column also increases to three. Hence, after shifting second blockage location 620b and third blockage location 620c, the maximum pin access point number for each of the first column, the second column, and the third column is equal to the maximum pin access point number At stage 465 of method 400, a cell layout with the blockage locations with the maximum pin access point number is generated. In accordance with example embodiments, the presence of the blockage locations reduces an overlap between the routing pins of the cell there by reducing a capacitance of the cell. Reduction in the capacitance of also reduce a power consumption of the cell.

Figure 7:
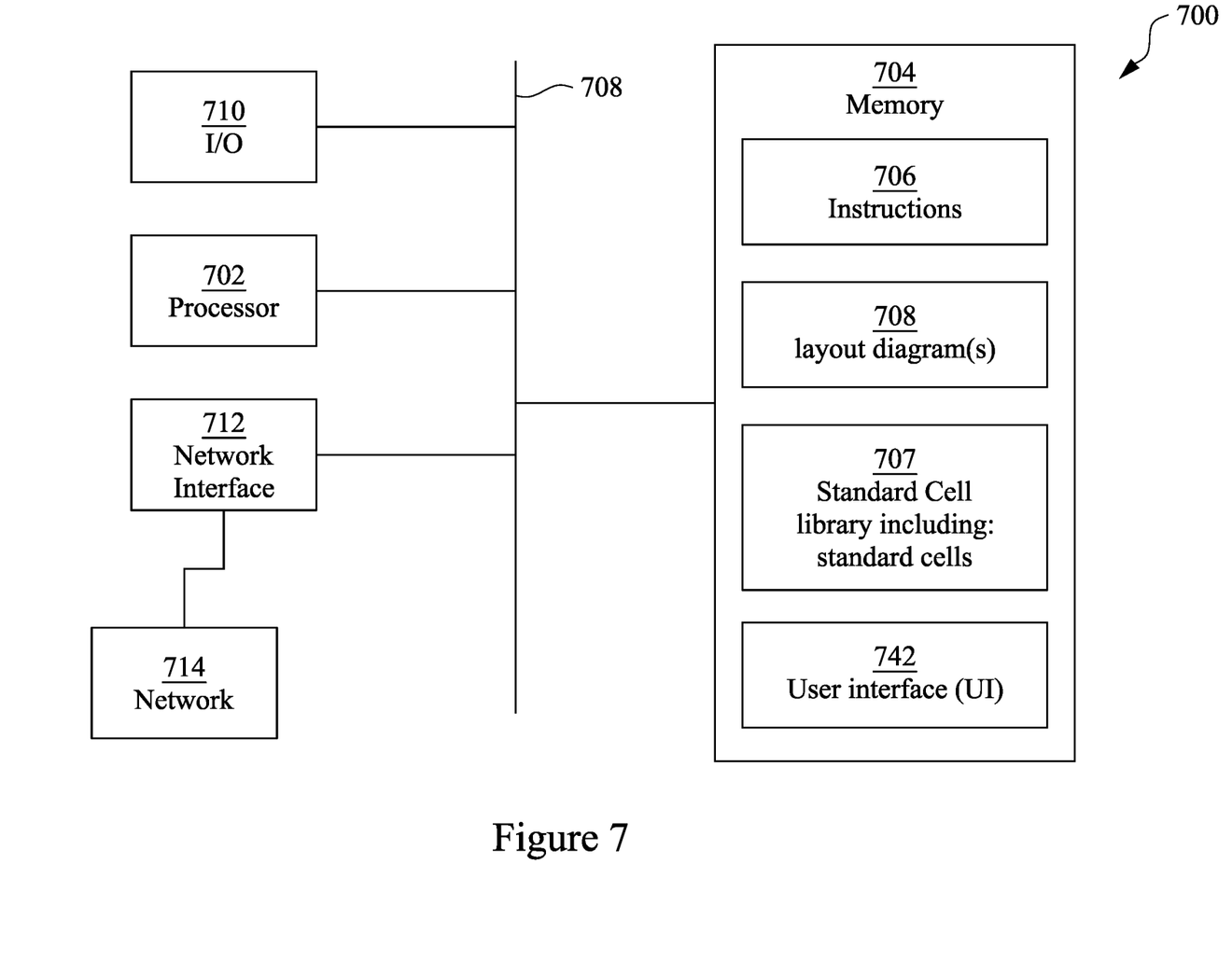
FIG. 7 is a diagram illustrating an example Electronic Design Automation (EDA) system in accordance with some embodiments.

FIG. 7 is a block diagram of an example Electronic Design Automation (EDA) system 700 in accordance with some embodiments. Methods described herein with reference to FIGS. 1-6 of designing layout diagrams represent wire arrangement, in accordance with one or more embodiments, are implementable for example, using EDA system 700.

In some embodiments, EDA system 700 is a computing device having a hardware processor 702 and a non-transitory computer-readable storage medium 704. Computer readable storage medium 704, amongst other things, is encoded with, i.e., stores, computer program code 706, where computer program code 706 is a set of computer-executable instructions. Execution of computer program code 706 by processor 702 represents (at least in part) an EDA tool which implements a portion or all of, e.g., the methods described herein in accordance with one or more corresponding embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause EDA system 700 to be usable for performing a portion or all of the noted processes and/or methods. In example embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause EDA system 700 (where such execution represents (at least in part) the EDA tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores library 707 of standard cells including such standard cells corresponding to cells disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows EDA system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

EDA system 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
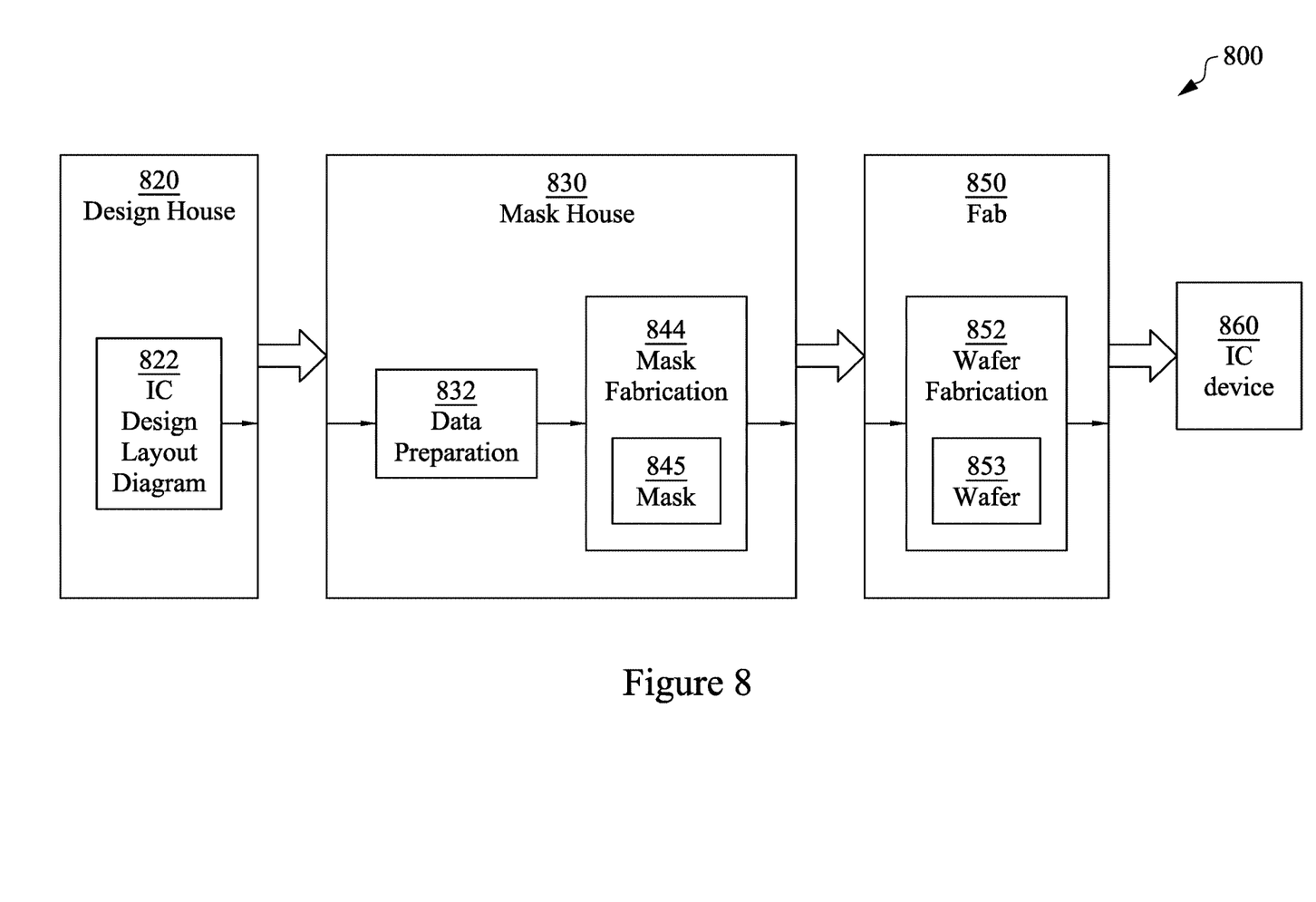
FIG. 8 is a diagram illustrating an example of a semiconductor device manufacturing system, and an IC manufacturing flow associated therewith, in accordance with some embodiments.

FIG. 8 is a block diagram of semiconductor device, e.g., an integrated circuit (IC), manufacturing system 800, and an IC manufacturing flow associated therewith, in accordance with some embodiments. In some embodiments, based on a layout diagram, e.g., one or more of the layout diagrams disclosed herein in accordance with one or more corresponding embodiments, or the like, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. In examples, IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. Design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In various embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

In accordance with example embodiments, a method of forming a circuit layout comprises: receiving a circuit layout associated with a circuit; performing a parallel pattern recognition on the circuit layout, wherein performing the parallel pattern recognition comprises determining that there is a parallel pattern in the circuit layout; initiating, in response to determining that there is a parallel pattern in the circuit layout, a cell swap for a first cell associated with the parallel pattern with a second cell; and performing, after the cell swap for the first cell, engineering change order routing to connect the second cell in the circuit layout.

In example embodiments, a method of creating a cell layout comprises: selecting a first metal track having a pin access point; applying a minimum length for a second metal plate on a second metal track at a first position, wherein the minimum length for the second metal plate at the first position overlaps at the pin access point with the first metal track; determining that the minimum length for the second metal plate at the first position satisfies an enclosure distance associated with the cell layout; determining, in response to determining that the minimum length for the second metal plate at the first position satisfies the enclosure distance associated with the cell layout, that the minimum length for the second metal plate at the first position is within a closest boundary from the first metal track; determining, in response to determining that the minimum length for the second metal plate at the first position is within the closest boundary from the first metal track, that a number of pin access points for the cell layout is more than a predetermined number of pin access points; and defining, in response to determining that the number of the pin access points for the cell layout is more than the predetermined number of pin access points, a first blockage location for the second metal plate at a first location on a second metal track.

In accordance with example embodiments, a system for forming a circuit layout comprises: a memory; and a processor connected to the memory, wherein the processor is operable to: receive a circuit layout associated with a circuit; determine that an input pin and an output pin of a first cell of the circuit comprises a parallel pattern; determine, in response to determining that the input pin and the output pin of the first cell of the circuit comprises the parallel pattern, a second cell from a cell library, the second cell being electrically equivalent to the first cell; swap the first cell with the second cell in the circuit layout; and perform an engineering change order routing to connect the second cell in the circuit layout.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a circuit layout, the method comprising:
   receiving a circuit layout associated with a circuit;
   performing a parallel pattern recognition on the circuit layout, wherein performing the parallel pattern recognition comprises determining that there is a parallel pattern in the circuit layout, and wherein determining that there is the parallel pattern in the circuit layout comprises performing an image recognition process to determine the parallel pattern in the circuit layout;

initiating, in response to determining that there is a parallel pattern in the circuit layout, a cell swap for a first cell associated with the parallel pattern with a second cell;

performing, after the cell swap for the first cell, engineering change order routing to connect the second cell in the circuit layout; and providing an updated circuit layout comprising the second cell.

2. The method of claim 1, wherein determining that there is the parallel pattern in the circuit layout comprises performing an image recognition process to determine an overlap on a projection of a first pin of the cell on to a second pin of the cell in the circuit layout.

3. The method of claim 2, wherein the first pin comprises an input pin and the second pin comprises an output pin.

4. The method of claim 1, wherein initiating the cell swap comprises:

determining the second cell from a cell library, the second cell being electrical equivalent of the first cell; and swapping the first cell with the second cell.

5. The method of claim 1, wherein initiating the cell swap comprises:

determining the second cell from a cell library, the second cell being electrical equivalent of the first cell and having a different pin style from the first cell; and swapping the first cell with the second cell.

6. The method of claim 1, further comprising performing, after performing the engineering change order routing, a design rule check on the updated circuit layout.

7. The method of claim 6, further comprising performing the parallel pattern recognition on the updated circuit layout after performing the design rule check.

8. The method of claim 7, further comprising:

determining, after performing the parallel pattern recognition on the updated circuit layout, that there is no parallel pattern in the updated circuit layout;

providing, in response to determining that there is no parallel pattern in the updated circuit layout after performing the parallel pattern recognition on the updated circuit layout, the updated circuit layout.

9. A method of forming a circuit layout, the method comprising:

receiving a circuit layout associated with a circuit;

performing a parallel pattern recognition on the circuit layout, wherein performing the parallel pattern recognition comprises determining that there is a parallel pattern in the circuit layout, and wherein determining that there is the parallel pattern in the circuit layout comprises determining that there is an overlap on a projection of a first pin of the cell on to a second pin of the cell in the circuit layout;

initiating, in response to determining that there is the parallel pattern in the circuit layout, a cell swap for a first cell associated with the parallel pattern with a second cell;

performing, after the cell swap for the first cell, engineering change order routing to connect the second cell in the circuit layout; and providing an updated circuit layout comprising the second cell.

10. The method of claim 9, wherein determining that there is an overlap on the projection of the first pin of the cell on to the second pin of the cell in the circuit layout comprises performing an image recognition process to determine that there is an overlap on the projection of the first pin of the cell on to the second pin of the cell in the circuit layout.

11. The method of claim 9, wherein the first pin comprises an input pin and the second pin comprises an output pin.

12. The method of claim 9, wherein initiating the cell swap comprises:

determining the second cell from a cell library, the second cell being electrical equivalent of the first cell; and swapping the first cell with the second cell.

13. The method of claim 9, wherein initiating the cell swap comprises:

determining the second cell from a cell library, the second cell being electrical equivalent of the first cell and having a different pin style from the first cell; and swapping the first cell with the second cell.

14. The method of claim 9, further comprising performing, after performing the engineering change order routing, a design rule check on the updated circuit layout.

15. The method of claim 14, further comprising performing the parallel pattern recognition on the updated circuit layout after performing the design rule check.

16. The method of claim 15, further comprising:

determining, after performing the parallel pattern recognition on the updated circuit layout, that there is no parallel pattern in the updated circuit layout;

providing, in response to determining that there is no parallel pattern in the updated circuit layout after performing the parallel pattern recognition on the updated circuit layout, the updated circuit layout.

17. A system for forming a circuit layout, the system comprising:

a memory; and a processor connected to the memory, wherein the processor is operable to:

receive a circuit layout associated with a circuit;

perform a parallel pattern recognition on the circuit layout, wherein the processor being operable to perform the parallel pattern recognition comprises the processor being operable to determine that there is a parallel pattern in the circuit layout;

initiate, in response to determining that there is a parallel pattern in the circuit layout, a cell swap for a first cell associated with the parallel pattern with a second cell wherein the processor being operable to initiate the cell swap comprises the processor being operable to:

determine the second cell from a cell library, the second cell being electrical equivalent of the first cell, and swap the first cell with the second cell;

perform, after the cell swap for the first cell, engineering change order routing to connect the second cell in the circuit layout; and provide an updated circuit layout comprising the second cell.

18. The apparatus of claim 17, wherein the processor being operable to determine that there is the parallel pattern in the circuit layout comprises the processor being operable to perform an image recognition process to determine the parallel pattern in the circuit layout.

19. The apparatus of claim 17, wherein the processor being operable to determine that there is the parallel pattern in the circuit layout comprises the processor being operable to determine that there is an overlap on a projection of a first pin of the cell on to a second pin of the cell in the circuit layout.

20. The apparatus of claim 17, wherein the processor being further operable to perform, after performing the engineering change order routing, a design rule check on the updated circuit layout.

\* \* \* \* \*